US008817473B2

(12) United States Patent  
Babish et al.

(10) Patent No.: US 8,817,473 B2  
(45) Date of Patent: Aug. 26, 2014

(54) LIQUID COOLING SYSTEM FOR MODULAR ELECTRONIC SYSTEMS

(75) Inventors: Eyal Babish, Zichron Yaacov (IL); Rafi Amarzoyev, Ramat Yishai (IL); Eyal Waldman, Tel Aviv (IL)

(73) Assignee: Mellanox Technologies Ltd., Yokneam (IL)

( * ) Notice: Subject to any disclaimer, the term of this patent is extended or adjusted under 35 U.S.C. 154(b) by 317 days.

(21) Appl. No.: 13/245,078

(22) Filed: Sep. 26, 2011

(65) Prior Publication Data

US 2013/0077238 A1    Mar. 28, 2013

(51) Int. Cl.
  *H05K 7/20* (2006.01)
  *F28F 7/00* (2006.01)
  *H01L 23/473* (2006.01)
(52) U.S. Cl.
  CPC .......... *H01L 23/473* (2013.01); *H05K 7/20781* (2013.01); *H05K 7/20736* (2013.01)
  USPC .......................................... 361/699; 165/80.4
(58) Field of Classification Search
  USPC ....................................................... 361/699
  See application file for complete search history.

(56) References Cited

U.S. PATENT DOCUMENTS

| 4,825,337 | A  | * | 4/1989  | Karpman ....................... 361/716 |
| 5,640,302 | A  | * | 6/1997  | Kikinis .................... 361/679.41 |
| 6,349,035 | B1 | * | 2/2002  | Koenen ......................... 361/719 |
| 6,643,132 | B2 | * | 11/2003 | Faneuf et al. ................. 361/700 |
| 6,693,797 | B2 | * | 2/2004  | Faneuf et al. ................. 361/689 |
| 6,776,221 | B2 | * | 8/2004  | Montgomery et al. ......... 165/46 |
| 7,551,438 | B2 | * | 6/2009  | Seki .............................. 361/699 |
| 7,869,215 | B2 | * | 1/2011  | Hung et al. ................... 361/704 |

* cited by examiner

*Primary Examiner* — Gregory Thompson
(74) *Attorney, Agent, or Firm* — Mark M. Friedman

(57) ABSTRACT

A system for cooling an integrated circuit of an electronic device includes a cooling body and a shelf that is positioned relative to the cooling body for the device to be reversibly inserted onto the shelf so that the cooling body is in thermal contact with the integrated circuit. The cooling body is cooled by introducing a fluid therein via an input conduit. The hot fluid is received from the cooling body by an output conduit and is cooled for recycling. The housing of the electronic device includes a rearward gap that admits the cooling body into the housing of the electronic device. Preferably, further cooling is provided by forcing a gas to flow past the output conduit.

23 Claims, 5 Drawing Sheets

LIQUID COOLING SYSTEM FOR MODULAR ELECTRONIC SYSTEMS

FIELD AND BACKGROUND OF THE INVENTION

The present invention relates to cooling systems and, more particularly, to a cooling system for integrated circuits of modular electronic devices and to modular electronic devices adapted to be cooled by such a system.

As the components of integrated circuits become ever smaller and faster, the heat generated by these circuits increases, to the point that absent active cooling of the circuits, this heat is liable to damage or destroy the circuits. Fans for blowing air over integrated circuits to cool them long have been a feature of personal computers. Such forced air cooling is inadequate, in and of itself, for many modern integrated circuits. Therefore, liquids, such as water, that have much higher heat capacities than gases such as air, have begun to be used to cool integrated circuits. For example, Hamman, in U.S. Pat. No. 6,999,316, that is incorporated by reference for all purposes as if fully set forth herein, teaches providing a printed circuit board with internal conduits for a cooling fluid. The internal conduits supply cool fluid to, and remove hot fluid from, a heat transfer unit that is in permanent thermal contact with an integrated circuit (specifically, a processor) that is mounted on the circuit board. The internal conduits are provided with fittings for reversibly connecting the internal conduits to external conduits that supply cool fluid to the circuit board and send hot fluid to a heat exchanger to be cooled and recycled. Such cooling systems suffer from the disadvantage that the fittings are liable to leak, especially when one circuit board is swapped for another circuit board, thereby wasting cooling fluid and running the risk, if the cooling fluid is electrically conductive, of shorting out the integrated circuit.

It would be highly advantageous to have a cooling system for electronic devices that uses a fluid to cool the devices' integrated circuits without risking such leakage.

SUMMARY OF THE INVENTION

According to the present invention there is provided a system for cooling an integrated circuit of an electronic device, including: (a) a cooling body; (b) a shelf, positioned relative to the cooling body for reversible insertion of the electronic device onto the shelf such that upon the reversible insertion, the cooling body comes into thermal contact with the integrated circuit; (c) an input conduit, in fluid communication with the cooling body, for introducing a fluid into the cooling body; and (d) an output conduit, in fluid communication with the cooling body, for receiving the fluid from the cooling body.

According to the present invention there is provided an electronic device including: (a) a housing including a base; and (b) an integrated circuit, positioned on the base so that when the electronic device is reversibly inserted onto a shelf of a system that also includes a cooling body, the cooling body enters the housing and comes into thermal contact with the integrated circuit.

According to the present invention there is provided a method of cooling an integrated circuit of an electronic device, including the steps of: (a) providing a cooling body and a shelf, (b) configuring the electronic device, and positioning the shelf relative to the cooling body, so that when the electronic device is inserted reversibly onto the shelf, the cooling body comes into thermal contact with the integrated circuit; (c) introducing a heat-absorbing fluid to the cooling body via an input conduit; (d) inserting the electronic device onto the shelf; and (e) withdrawing at least a portion of the fluid from the cooling body via an output conduit.

According to the present invention there is provided a method of operating a pair of electronic devices, each electronic device including a respective integrated circuit, including the steps of: (a) providing a cooling body and a shelf; (b) configuring the electronic devices, and positioning the shelf relative to the cooling body, so that when either one of the electronic devices is inserted reversibly onto the shelf, the cooling body comes into thermal contact with the respective integrated circuit of that electronic device; (c) introducing a heat-absorbing fluid to the cooling body; (d) withdrawing at least a portion of the fluid from the cooling body via an output conduit; (e) inserting a first one of the electronic devices onto the shelf; (f) removing the first electronic device from the shelf; and (g) inserting a second one of the electronic devices onto the shelf.

A basic system of the present invention, for cooling an integrated circuit of an electronic device, includes a cooling body, a shelf, an input conduit and an output conduit. The shelf is positioned relative to the cooling body so that the electronic device can be reversibly inserted onto the shelf so that, when the electronic device is fully inserted onto the shelf, the cooling body comes into thermal contact with the integrated circuit. The input and output conduits are in fluid communication with the cooling body. The input conduit is for introducing a heat-absorbing fluid, i.e., a fluid having a lower temperature than the operating temperature of the integrated circuit, into the cooling body. The output conduit is for receiving the fluid from the cooling body.

Preferably, the system includes a barrier for guiding the insertion of the electronic device onto the shelf so that the cooling body comes into thermal contact with the integrated circuit. In the preferred embodiments described below, this barrier includes the backplane of the rack and the sides of the cooling body.

Preferably, after the electronic device has been fully inserted onto the shelf, the cooling body covers substantially all of the integrated circuit.

Preferably, the system also includes a mechanism for maintaining the cooling body in thermal contact with the integrated circuit.

Preferably, the system also includes a mechanism for protecting the integrated circuit from damage as the electronic device is inserted onto the shelf.

In principle, the fluid could be a gas, but in practice the fluid almost always is a liquid because liquids have much higher heat capacities than gases.

Preferably, the input and output conduits are rigidly attached to the cooling body.

Preferably, the system also includes a heat exchanger, operatively coupled to the output conduit, for removing heat from the fluid that is received by the output conduit. Most preferably, the heat exchanger also recycles the cooled fluid to the input conduit.

Preferably, the system also includes a mechanism for forcing a gas such as air to flow past the output conduit. Generally, the gas also flows past the input conduit, but the main purpose of the gas flow is to cool the output conduit.

A basic rack of the present invention includes several instances of the system. The basic rack also includes a supply conduit for supplying the fluid to the input conduits and a drain conduit for receiving the fluid from the output conduits.

Preferably, the rack also includes a heat exchanger, operatively coupled to the output conduits, for removing heat from the fluid that is received by the output conduits. Most preferably, the heat exchanger also recycles the cooled fluid to the input conduits.

Preferably, the rack also includes a mechanism for forcing a gas such as air to flow past the output conduits. Generally, the gas also flows past the input conduits, but the main purpose of the gas flow is to cool the output conduits.

A basic electronic device of the present invention includes a housing and an integrated circuit. The housing includes a base. The integrated circuit is positioned on the base so that when the electronic device is reversibly inserted onto a shelf of a basic system of the present invention, the cooling body enters the housing and comes into thermal contact with the integrated circuit.

Preferably, the housing of the electronic device also includes a rearward gap. When the electronic device is reversibly inserted onto the shelf, the cooling body enters the housing via the rearward gap and comes into thermal contact with the integrated circuit.

Preferably, the housing of the electronic device also includes a wall that includes a ventilation aperture.

Preferably, the housing of the electronic device also includes a top positioned relative to the base so as to maintain the cooling body in thermal contact with the integrated circuit after the electronic device has been inserted onto the shelf.

Preferably, the electronic device also includes a mechanism for protecting the integrated circuit from damage as the electronic device is inserted onto the shelf.

In a basic method of cooling an integrated circuit of an electronic device, a cooling body and a shelf are provided. The electronic device is configured, and the shelf is positioned relative to the cooling body, so that when the electronic device is inserted reversibly onto the shelf, the cooling body comes into thermal contact with the integrated circuit. A heat-absorbing fluid, i.e., a fluid having a lower temperature than the operating temperature of the integrated circuit, is introduced to the cooling body via an input conduit, and the electronic device is inserted onto the shelf. At least a portion of the fluid is withdrawn from the cooling body via an output conduit.

Preferably, heat is withdrawn from the at least portion of the fluid that is withdrawn from the cooling body. Most preferably, the at least portion of the fluid from which the heat has been withdrawn is re-introduced to the cooling body.

Preferably, a gas is forced to flow past the output conduit.

Because the electronic device, the cooling body and the shelf are configured for reversible insertion of the electronic device onto the shelf, the electronic device may be removed from the shelf at any time subsequent to the insertion of the electronic device onto the shelf.

In a method of operating a pair of electronic devices, each of which includes a respective integrated circuit, a cooling body and a shelf are provided. The electronic devices are configured, and the shelf is positioned relative to the cooling body, so that when either one of the electronic devices is inserted reversibly onto the shelf, the cooling body comes into thermal contact with the respective integrated circuit of that electronic device. A heat-absorbing fluid is introduced to the cooling body via an input conduit, with at least a portion of the fluid being withdrawn from the cooling body via an output conduit, and a first one of the electronic devices is inserted onto the shelf. Later, the first electronic device is removed from the shelf and the other electronic device is inserted onto the shelf.

BRIEF DESCRIPTION OF THE DRAWINGS

Various embodiments are herein described, by way of example only, with reference to the accompanying drawings, wherein.

DESCRIPTION OF THE PREFERRED EMBODIMENTS

The principles and operation of a cooling system for electronic devices according to the present invention may be better understood with reference to the drawings and the accompanying description.

Figure 1:
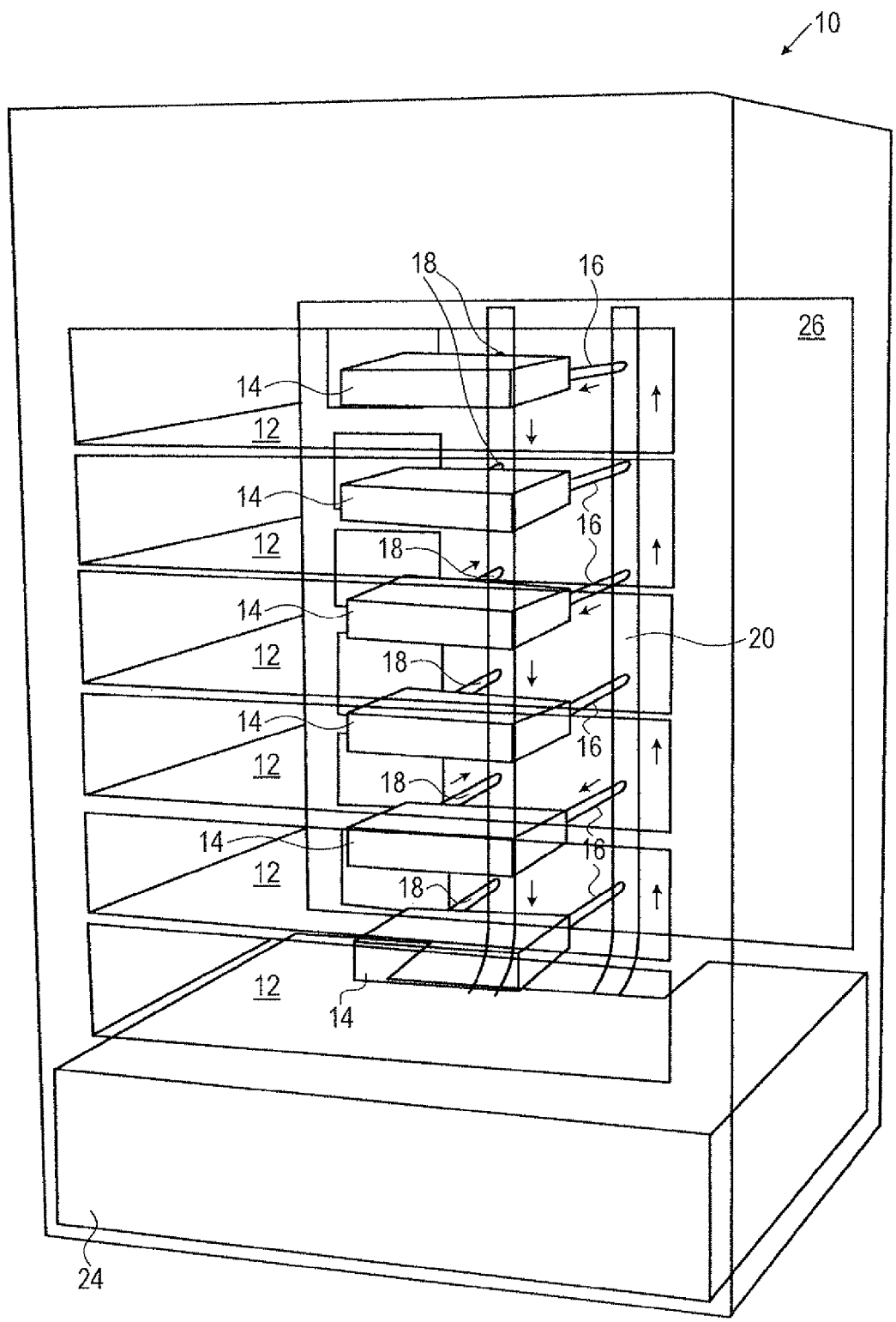
FIG. 1 is a partially cut-away perspective view of a rack of the present invention.
Figure 2:
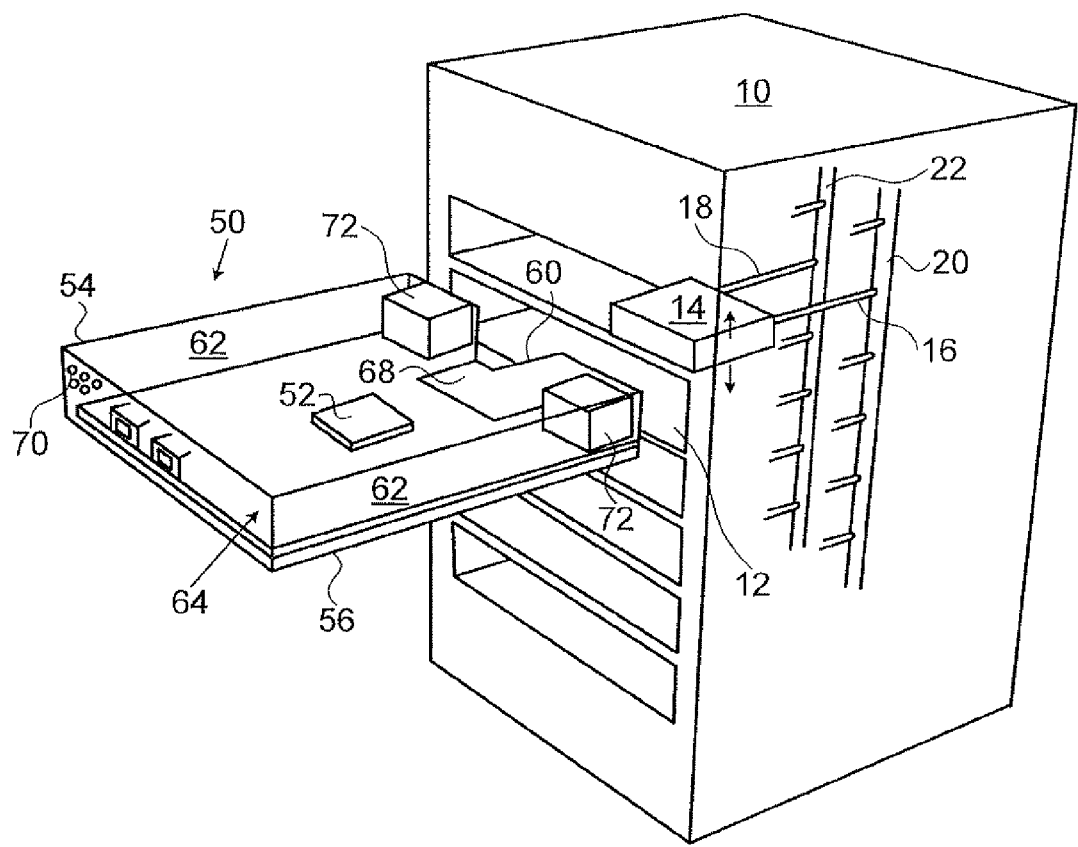
FIG. 2 shows the rack of FIG. 1 together with an electronic device of the present invention.

Referring now to the drawings, FIG. 1 is a partially cut-away perspective view of a rack 10 for the installation therein of six electronic devices such as electronic device 50 that is illustrated in FIG. 2. Rack 10 includes six shelves 12. Each shelf is provided with a respective cooling body 14 for cooling an integrated circuit of the electronic device that is mounted on the corresponding shelf 12.

Cooling bodies 14 are hollow boxes made of a thermally conductive material such as copper or aluminum. Each cooling body 14 is provided with an input conduit 16 for introducing a cooling fluid to cooling body 14 and an output conduit 18 for receiving the heated cooling fluid from cooling body 14. In some embodiments, cooling body 14 is merely a box in which the cooling fluid flows freely. In other embodiments, cooling body 14 includes a spiral, helical or serpentine pipe that connects to input conduit 16 and to output conduit 18 and that occupies most of the interior of cooling body 14 by virtue of having a shape such as a spiral, helical or serpentine shape, and the flow of the cooling fluid within cooling body 14 is confined to the serpentine pipe.

The cooling fluid typically is water. In special applications, the cooling fluid could be a different fluid, for example a propylene-glycol-based antifreeze.

Input conduits 16 are connected to a supply conduit 20 that supplies cool cooling fluid to input conduits 16. Output conduits 18 are connected to a drain conduit 22 that receives hot cooling fluid from output conduits 18. The hot cooling fluid is carried by drain conduit 22 to a heat exchanger 24 where the hot cooling fluid is cooled for recycling to cooling bodies 14 via supply conduit 20 and input conduits 16. Typically, heat exchanger 24 is a radiator that uses forced air circulation to remove the heat from the cooling fluid. The circulation of the cooling fluid through conduits 16, 18, 20 and 22 and through heat exchanger 24 could be convective circulation, or alternatively could be forced circulation that is driven by a pump. The arrows in FIG. 1 show the direction of the circulation of the cooling fluid.

It is not strictly necessary for heat exchanger 24 to be mounted on rack 10. Heat exchanger 24 could be physically separate from rack 10 (apart from being in fluid communication with conduits 20 and 22), and even in a different room than rack 10.

Rack 10 also includes a backplane 26. More details of backplane 26 are provided below in connection with FIG. 3.

FIG. 2 shows an electronic device 50, for example a field replaceable unit, of a type that is adapted to have its integrated circuit 52 cooled by a cooling body 14, positioned for insertion onto a shelf 12. Device 50 includes a housing 54 that in turn includes a base 56, a top 60, two side walls 62 and a front wall 64. The electronic components of device 50 include an integrated circuit 52, on base 56, that needs to be cooled by cooling body 14. The electrical components of device 50 include two plugs 72 for plugging into backplane 26 as described below in connection with FIG. 3. Device 50 is installed in rack 10 by being placed on the appropriate shelf 12 and being slid towards backplane 26 until cooling body 14 covers integrated circuit 52.

The arrows in FIG. 2 show that conduits 16 and 18 are sufficiently flexible to provide limited up and down movement of cooling body 14, to facilitate the installation of device 50 onto shelf 12 with cooling body 14 covering integrated circuit 52.

Figure 3:
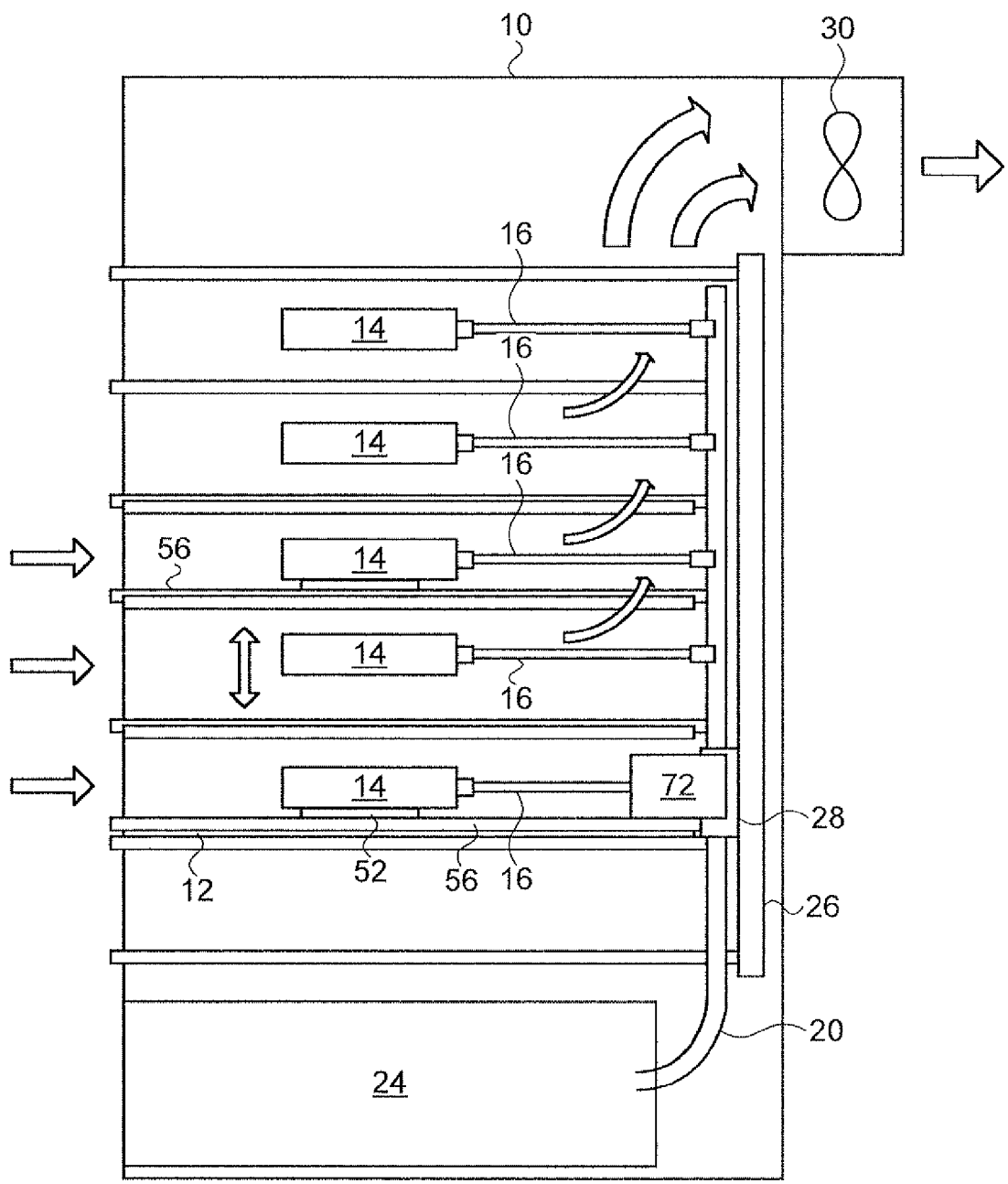
FIG. 3 is a cut-away side view of the rack of FIG. 1 with an electronic device of the present invention installed on one of the shelves.

FIG. 3 is a cut-away side view of rack 10, showing two electronic devices 50 installed on one of shelves 12. More precisely, only integrated circuits 52 and bases 56 of the electronic devices 50, and one of plugs 72 of one of the electronic devices 50, are shown in FIG. 3. In each occupied shelf 12, cooling body 14 rests on top of integrated circuit 52, covering the entire top surface of integrated circuit 52, and in thermal contact with integrated circuit 52. Plug 72 is shown plugged into a backplane connector 28 of backplane 26, for providing electrical power to electronic device 50 and for providing an avenue of wired communication between this electronic device 50 and other electronic devices 50 that are installed in rack 10.

The walls of plugs 72 that face each other define a gap 68 therebetween through which cooling body 14 passes to enter housing 54 as device 50 is inserted onto shelf 12. Preferably, gap 68 is about as wide as cooling body 14, so that the inner side walls of plugs 72 serve as guides for the correct lateral positioning of device 50 on shelf 12 for cooling body 14 to cover integrated circuit 52. Backplane 26 serves as a backstop for the insertion of device 50 onto shelf 12 to ensure that housing 50 is not inserted too far into rack 10 for cooling body 14 to cover integrated circuit 52. Hence, backplane 26, together with the lateral sides of cooling body 14 that just fit into gap 68, guide the insertion of electronic device 50 onto shelf 12 in a manner that guarantees that, after electronic device 50 is fully inserted onto shelf 12, cooling body 14 covers all of integrated circuit 52. Gap 68 is an example of what is termed a "rearward" gap in the appended claims, and is "rearward" in the sense that gap 68 is in the portion of electronic device 50 that is inmost on rack 10 (closest to backplane 26) when electronic device 50 is installed on a shelf 12 of rack 10.

FIG. 3 also shows that the cooling provided by the cooling fluid is supplemented by forced air cooling induced by a fan 30. The single-headed arrows in FIG. 3 show the direction of the flow of the cooling air. As in FIG. 2, the double-headed arrow in FIG. 3 indicates that conduits 16 and 18 are sufficiently flexible to provide limited up and down movement of cooling body 14. As shown in FIG. 2, front wall 64 of electronic device 50 includes ventilation holes 70 to facilitate the circulation of cooling air into and out of housing 54.

For illustrational simplicity, FIGS. 1-3 show a rack 10 all of whose shelves 12 face in the same direction. The scope of the present invention also includes two-sided racks whose shelves face in opposite directions, away from a midplane that has the same functionality as backplane 26: providing connectors for electrical power and avenues of wired communication for the electronic devices installed on the rack, and serving as a backstop for the insertion of the electronic devices so that the rack's cooling bodies cover the integrated circuits of the electronic devices.

Electronic devices 50 are modular in the sense that not all shelves 12 need be occupied by electronic devices 50. Indeed, FIG. 3 shows only two out of six shelves 12 occupied by electronic devices 50.

Figure 4A:
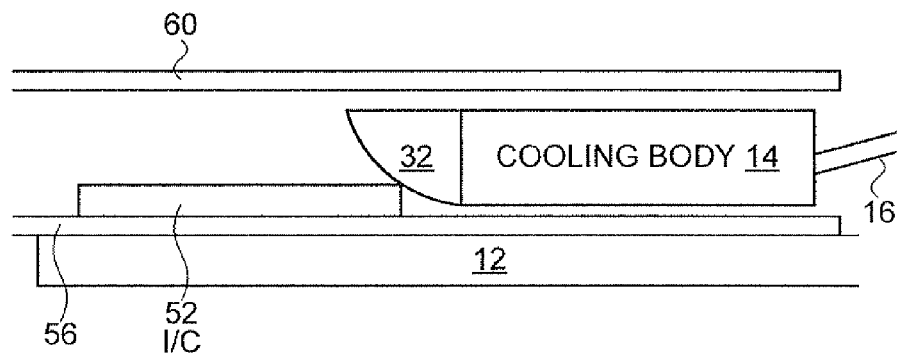
FIGS. 4A and 4B show two stages in the insertion of one embodiment of the electronic device onto a shelf of one embodiment of the rack.
Figure 4B:
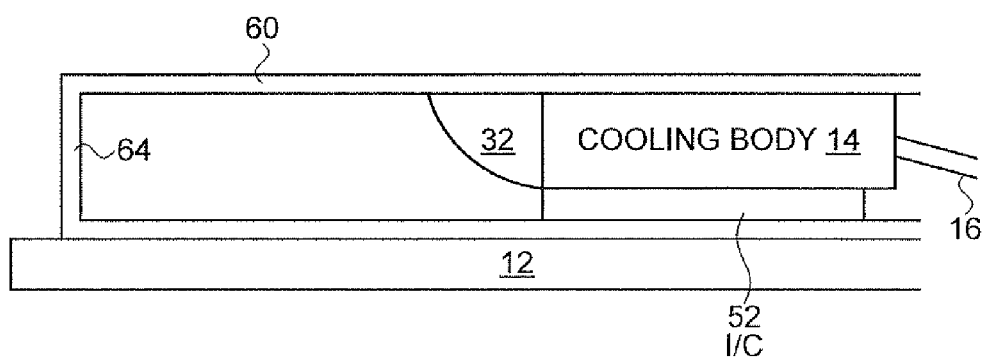

FIGS. 4A and 4B show two stages in the installation of one embodiment of electronic device 50 onto a shelf 12 of one embodiment of rack 10. In this embodiment of rack 10, each cooling body 14 is provided with a curved, forward shield 32 to keep cooling body 14 from damaging integrated circuit 52 as electronic device 50 is slid (rightward in FIGS. 4A and 4B) onto shelf 12. FIG. 4A shows the situation as integrated circuit 52 begins to come in contact with shield 32. FIG. 4B shows the situation after the electronic device has been fully inserted onto shelf 12 with cooling body 14 now completely covering integrated circuit 52. In this embodiment, top 60 presses down on cooling body 14 to maintain the thermal contact between cooling body 14 and integrated circuit 52. In the embodiment illustrated in FIG. 3, conduits 16 and 18 are flexible enough to allow integrated circuit 52 to be inserted beneath cooling body 14, but are rigid enough to urge cooling body 14 downward to maintain the thermal contact of cooling body 14 with integrated circuit 52 once integrated circuit 52 has been inserted beneath cooling body 14.

Figure 5A:
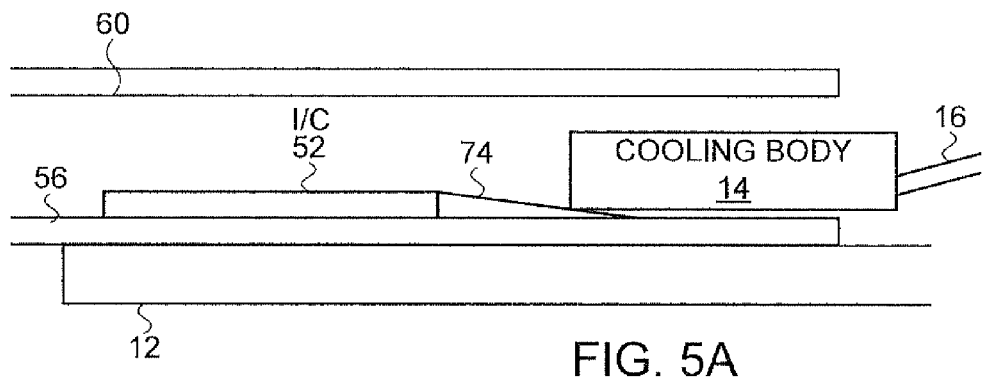
FIGS. 5A and 5B show two stages in the insertion of another embodiment of the electronic device onto a shelf of another embodiment of the rack.
Figure 5B:
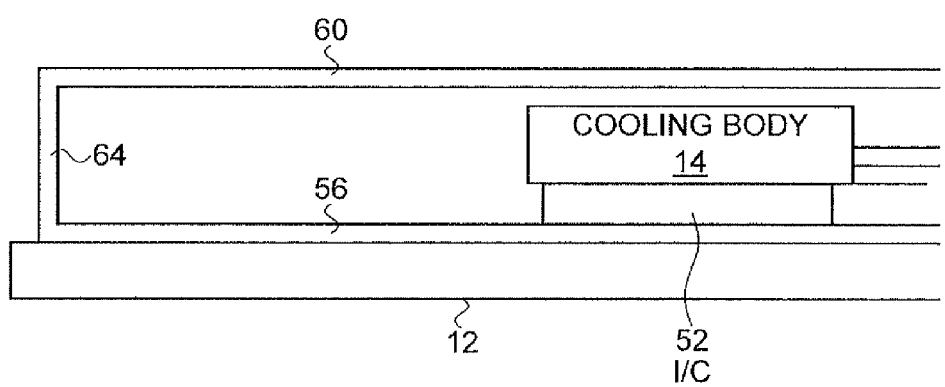

FIGS. 5A and 5B show two stages in the installation of another embodiment of electronic device 50 onto a shelf 12 of another embodiment of rack 10. In these embodiments, instead of providing shields on cooling bodies 14, a ramp 74 is installed rearward of integrated circuit 52 on base 56 of each electronic device 50 to keep cooling body 14 from damaging integrated circuit 52 as electronic device 50 is slid (rightward in FIGS. 5A and 5B) onto shelf 12. As in the embodiment illustrated in FIG. 3, in this embodiment of rack 10 conduits 16 and 18 are flexible enough to allow integrated circuit 52 to be inserted beneath cooling body 14 but are rigid enough to urge cooling body 14 downward to maintain the thermal contact of cooling body 14 with integrated circuit 52 once integrated circuit 52 has been inserted beneath cooling body 14.

That electronic device 50 is easily inserted onto shelf 12 and removed from shelf 12 makes it easy to replace a defective or obsolescent electronic device 50 with a replacement electronic device 50 as needed.

While the invention has been described with respect to a limited number of embodiments, it will be appreciated that many variations, modifications and other applications of the invention may be made. Therefore, the claimed invention as recited in the claims that follow is not limited to the embodiments described herein.

What is claimed is:

1. A system for cooling an integrated circuit of an electronic device, comprising:
   (a) a cooling body;
   (b) a shelf, positioned relative to said cooling body for reversible insertion of the electronic device onto said shelf such that upon said reversible insertion, said cooling body comes into thermal contact with the integrated circuit, and such that said shelf keeps the integrated circuit in said thermal contact with said cooling body while the electronic device remains inserted onto said shelf;
   (c) an input conduit, in fluid communication with said cooling body, for introducing a fluid into said cooling body; and (d) an output conduit, in fluid communication with said cooling body, for receiving said fluid from said cooling body;

wherein said shelf is a sole component of the system that keeps the integrated circuit in said thermal contact with said cooling body.

2. The system of claim 1, further comprising:
(e) a barrier for guiding said insertion of the electronic device onto said shelf so that said cooling body comes into said thermal contact with the integrated circuit.

3. The system of claim 1, wherein said cooling body covers substantially all of said integrated circuit when the electronic device is inserted onto said shelf.

4. The system of claim 1, further comprising:
(e) a mechanism for maintaining said cooling body in said thermal contact with the integrated circuit.

5. The system of claim 1, further comprising:
(e) a mechanism for protecting the integrated circuit from damage as the electronic device is inserted onto said shelf.

6. The system of claim 1, wherein said input conduit and said output conduit are rigidly attached to said cooling body.

7. The system of claim 1, further comprising:
(e) a heat exchanger, operatively coupled to said output conduit, for removing heat from said fluid that is received by said output conduit.

8. The system of claim 7, wherein said heat exchanger also is operative to supply said fluid, from which said heat has been removed, to said input conduit.

9. The system of claim 1, further comprising:
(e) a mechanism for forcing a gas to flow past said output conduit.

10. A rack, for mounting a plurality of electronic devices, comprising:
(a) a plurality of the systems of claim 1;
(b) a supply conduit for supplying said fluid to said input conduits; and
(c) a drain conduit for receiving said fluid from said output conduits.

11. The rack of claim 10, further comprising:
(d) a heat exchanger, operatively coupled to said drain conduit, for removing heat from said fluid that is received by said drain conduit.

12. The rack of claim 11, wherein said heat exchanger also is operative to supply said fluid, from which said heat has been removed, to said supply conduit.

13. The rack of claim 10, further comprising:
(d) a mechanism for forcing a gas to flow past said output conduits.

14. An electronic device comprising:
(a) a housing including:
(i) a base, and
(ii) a rearward gap defined by a space between two components of the electronic device that are located at a rearward portion of the electronic device; and
(b) an integrated circuit, positioned on said base so that when the electronic device is reversibly inserted onto a shelf of a system that also includes a cooling body, the cooling body enters said housing and comes into thermal contact with said integrated circuit;

wherein, when the electronic device is reversibly inserted onto said shelf, said cooling body enters said housing via said rearward gap and comes into said thermal contact with said integrated circuit.

15. The electronic device of claim 14, wherein said housing includes a wall that includes at least one ventilation aperture.

16. The electronic device of claim 14, wherein said housing also includes a top positioned relative to said base so as to maintain said cooling body in said thermal contact with said integrated circuit after the electronic device has been inserted onto said shelf.

17. The electronic device of claim 14, further comprising:
(c) a mechanism for protecting said integrated circuit from damage as the electronic device is inserted onto said shelf.

18. A method of cooling an integrated circuit of an electronic device, comprising the steps of:
(a) providing a cooling body and a shelf;
(b) configuring the electronic device, and positioning said shelf relative to said cooling body, so that when the electronic device is inserted reversibly onto said shelf, said cooling body comes into thermal contact with the integrated circuit and so that said shelf keeps the integrated circuit in said thermal contact with said cooling body while the electronic device remains inserted onto said shelf;
(c) introducing a heat-absorbing fluid to said cooling body via an input conduit;
(d) inserting the electronic device onto said shelf; and
(e) withdrawing at least a portion of said fluid from said cooling body via an output conduit;

wherein the electronic device is configured, and said shelf is positioned relative to said cooling body, so that only said shelf keeps the integrated circuit in said thermal contact with said cooling body.

19. The method of claim 18, further comprising the step of:
(f) removing heat from said at least portion of said fluid that has been withdrawn from said cooling body.

20. The method of claim 19, further comprising the step of:
(g) re-introducing said at least portion of said fluid to said cooling body after removing said heat from said at least portion of said fluid.

21. The method of claim 18, further comprising the step of:
(f) forcing a gas to flow past said output conduit.

22. The method of claim 18, further comprising the step of:
(f) removing the electronic device from said shelf.

23. A method of operating a pair of electronic devices, each electronic device including a respective integrated circuit, comprising the steps of:
(a) providing a cooling body and a shelf;
(b) configuring the electronic devices, and positioning said shelf relative to said cooling body, so that when either one of the electronic devices is inserted reversibly onto said shelf, said cooling body comes into thermal contact with the respective integrated circuit of that electronic device and so that said shelf keeps the respective integrated circuit of that electronic device in said thermal contact with said cooling body while that electronic device remains inserted onto said shelf;
(c) introducing a heat-absorbing fluid to said cooling body via an input conduit;
(d) withdrawing at least a portion of said fluid from said cooling body via an output conduit;
(e) inserting a first one of the electronic devices onto said shelf; and
(f) removing the first electronic device from said shelf; and
(g) inserting a second one of the electronic devices onto said shelf, wherein the electronic devices are configured, and said shelf is positioned relative to said cooling body, so that only said shelf keeps the respective integrated circuit of that electronic device in said thermal contact with said cooling body.

* * * * *